United States Patent [19]
Hull et al.

[11] Patent Number: 4,897,579
[45] Date of Patent: Jan. 30, 1990

[54] METHOD OF PROCESSING MATERIALS USING AN INDUCTIVELY COUPLED PLASMA

[75] Inventors: Donald E. Hull; Thomas M. Bieniewski, both of Los Alamos, N. Mex.

[73] Assignee: The United States of America as represented by the United States Department of Energy, Washington, D.C.

[21] Appl. No.: 289,286

[22] Filed: Dec. 23, 1988

Related U.S. Application Data

[62] Division of Ser. No. 37,898, Apr. 13, 1987, Pat. No. 4,795,879.

[51] Int. Cl.$^4$ .......................... H01J 7/24; B23K 9/00
[52] U.S. Cl. .......................... 315/111.51; 313/231.31; 219/121.37; 219/121.48; 219/121.52; 219/121.59

[58] Field of Search ............. 315/111.51; 219/121.59, 219/76.16, 76.15, 121.48, 121.47, 121.52, 121.37; 313/231.31, 231.41, 231.51; 427/434; 75/0.5 C

[56] References Cited

U.S. PATENT DOCUMENTS

| | | | |
|---|---|---|---|
| 4,431,901 | 2/1984 | Hull | 219/121.52 |
| 4,795,879 | 1/1989 | Hull et al. | 219/121.59 |
| 4,812,166 | 3/1989 | Saiki et al. | 315/111.51 X |

*Primary Examiner*—Eugene R. LaRoche
*Assistant Examiner*—Seung Ham
*Attorney, Agent, or Firm*—David K. Cornwell; Paul D. Gaetjens; William R. Moser

[57] ABSTRACT

A method for making fine power using an inductively coupled plasma. The method provides a gas-free environment, since the plasma is formed without using a gas. The starting material used in the method is in solid form.

1 Claim, 3 Drawing Sheets

METHOD OF PROCESSING MATERIALS USING AN INDUCTIVELY COUPLED PLASMA

This is a division of application Ser. No. 037,898 filed Apr. 13, 1987, now U.S. Pat. No. 4,795,879.

BACKGROUND OF THE INVENTION

The invention disclosed herein is generally related to a method of using a high frequency induction plasma tubes, and more specifically to a method for processing materials using an inductively coupled plasma. This invention is the result of a contract with the Department of Energy (Contract No. W-7405-ENG-36).

High frequency induction plasma tubes are well-known for producing high temperature gaseous plasmas. Such plasmas are useful in a number of practical applications including high temperature spectroscopic studies, preparation of microcrystalline refractory materials, and making powders.

In conventional methods of forming metal vapors using a plasma tube, metal, usually as a gaseous compound or powder, is introduced into a gaseous plasma. The plasma is formed from an ionizable gas such as argon. The metal vapor is expanded through a nozzle and deposited on a cold surface. In a similar manner, the metal vapor can be converted to a very fine powder.

This method of forming powders and coating surfaces has major drawbacks. A starting material cannot be introduced into conventional plasma tubes without onerous processing. Specifically, the starting material must be either liquefied or formed into an aerosol or gaseous compound.

A second disadvantage of conventional methods of forming powders is that a gas is necessary in order to form the plasma. The gas promotes voids when the plasma tube is used for metal coating surfaces.

The reason that gas is necessary is that induction plasma tubes known in the art generally include an electrical induction coil surrounding an enclosure which contains an ionizable gas. The coil is connected to a source of high frequency (400 kHz to 5 MHz) electrical power. A quartz tube centered inside the coil typically defines the enclosure. It is believed that this type of conventional "induction" plasma tube is actually capacitively coupled with the electrical induction coil and the gas being one of the capacitor plates and the quartz tube being the dielectric material. If metal is used to form the plasma in this type of plasma tube, the metal deposits on the quartz wall. The metal, in effect, becomes part of the dielectric material and prevents the plasma from "seeing" the alternating electric field produced by the coil. Almost immediately, the metal deposit burns through the quartz enclosure.

Upon application of power to the induction coil in conventional plasma tubes, the gas is ionized producing a central core of hot gaseous plasma inside the enclosure. At low power levels the plasma is concentrated in the center of the enclosure such that there is reduced danger of heat damage to the enclosure walls. At high power levels, however, the plasma core is both hotter and larger in diameter. As a result, the quartz enclosure is easily damaged by the plasma, which typically attains temperatures on the order of 10,000° C. and above. This problem is aggravated by the fact that the plasma is typically subject to magnetic and electric instabilities that cause it to fluctuate in position and occasionally actually contact the enclosure walls. Operation at high power levels also results in the emission of intense ultraviolet radiation from the plasma, which ionizes the air around the enclosure and may result in electrical arcing in the induction coil.

These adverse effects have been overcome by the use of internal water-cooled shields as described and disclosed in U.S. Pat. No. 4,431,901 issued on Feb. 14, 1984, the teachings of which are hereby incorporated by reference. By using a thick segmented shield shaped in cross section to occlude line-of-sight transmissions of light, it is possible to get induction heating of the plasma because a current is induced around each of the individual segments. Without occluding line-of-sight transmissions of ultraviolet radiation from the plasma, the air around the windings is ionized which induces arcing of the plasma. A counterflow cooling system is used to cool the individual segments. Such an improved shielding system makes it possible to maintain a plasma at temperatures on the order of 10,000° C.

U.S. Pat. No. 4,431,901 does not suggest the use of the plasma tube for coating materials or for making ultrafine ultrapure powders. In addition, this patent does not contemplate the use of a pure metal plasma and, in fact, only mentions the use of an ionizable gas to form the plasma.

Accordingly, it is an object of the present invention to provide a method for producing ultrafine, ultrapure powders in a gas free environment.

It is also an object of the present invention to provide a method of coating material with a pure metal.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

To achieve the foregoing and other objects, and in accordance with the purposes of the present invention, as embodied and broadly described herein, the present invention includes the steps of forming a plasma using a solid material and collecting resulting vapor on a cold collection surface. In another aspect of the invention the enclosure of the induction plasma tube is evacuated. By evacuating the enclosure the user can make a gas-free, contaminant-free metal powder. In another aspect of the invention, a pure metal or ceramic plasma is formed by using a pure metal or ceramic ingot as the material introduced into the plasma tube. The resulting vapor is expanded onto a cold surface to form either pure ultrafine powders or pure metal or ceramic coatings.

One advantage of the invention is that a solid material may be used as a starting material for making powders. This eliminates the need for special processing to convert the solid material to a powder of gaseous compound.

A second advantage of the invention is that a gas-free plasma can be formed. A gas-free plasma produces higher quality coatings and powders.

These and other aspects of the invention are more fully set forth in the following detailed description of the preferred embodiments and in the accompanying drawings.

BRIEF DESCRIPTION OF THE DRAWINGS

The accompanying drawings, which are incorporated in and form a part of the specification, illustrate the embodiments of the present invention and, together with the description, serve to explain the principles of the invention. In the drawings.

DETAILED DESCRIPTION OF THE PREFERRED EMBODIMENT

Figure 1:
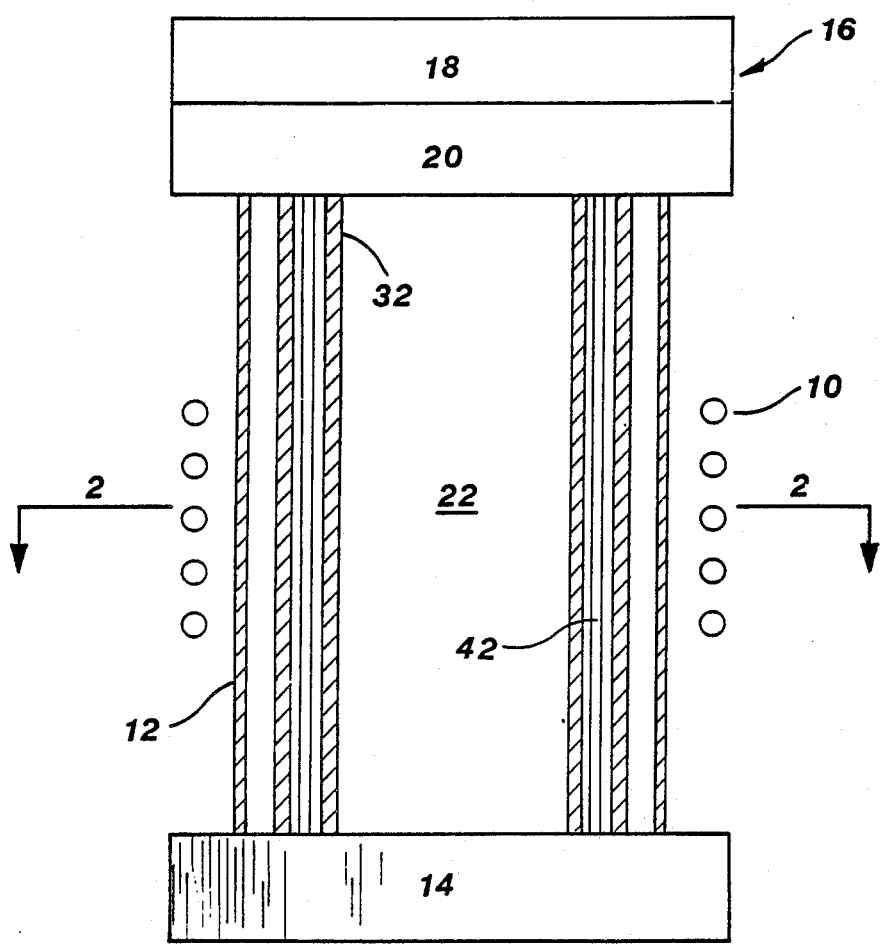
FIG. 1 is a side schematic of the induction plasma tube used with the invention.

FIG. 1 shows a cross-sectional schematic of the induction plasma tube used to process materials which includes a water-cooled copper induction coil 10 which surrounds a tubular quartz enclosure 12. The enclosure 12 extends upwardly from a water-cooled base 14 to an upper assembly 16 which includes water supply manifold 18 and water exhaust manifold 20. Supply and exhaust manifolds 18 and 20 include annular interior water channels which are connected to exterior supply and exhaust water fittings. Likewise, base 14 includes annular interior water cooling channels which are connected to one another and which are connected to exterior water supply and exhaust fittings. Base 14 and manifolds 18 and 20 are all annular so as to define central cylindrical cavity 22 wherein a plasma may be formed by application of a high frequency electrical current to induction coil 10.

Figure 2:
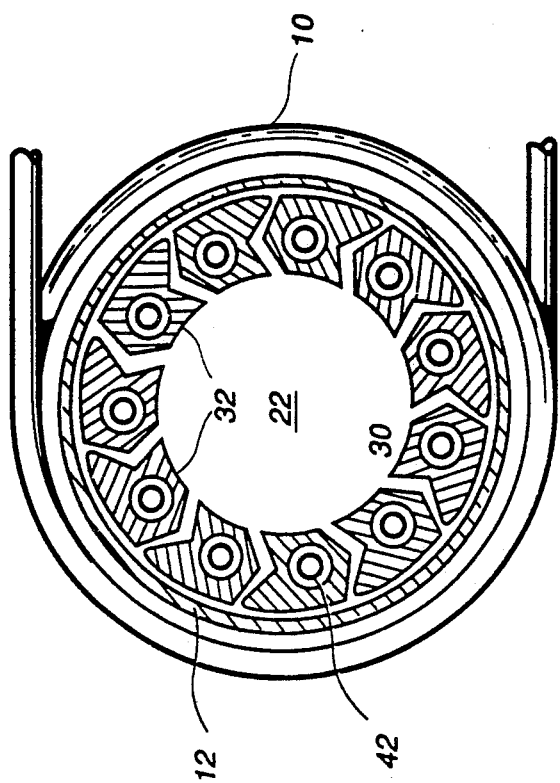
FIG. 2 is a plan view in cross section of the plasma tube illustrated in FIG. 1, taken along section line 2—2 of FIG. 1.

The induction plasma tube used to practice the present invention includes segmented shield 30 which consists of twelve substantially identical thick-walled copper tubes 32. The tubes are affixed at their upper ends to water exhaust manifold 20 and extend downwardly therefrom along the inside of the tubular quartz enclosure. Water supply tubes 42 extend the length of copper tubes 32 and are used to cool the individual shield segments. This can be seen best in FIG. 2. Details of the kind of plasma tube used to practice the invention are described in U.S. Pat. No. 4,431,901.

The plasma tube is typically operated at a frequency of 400 kHz to 5 MHz, at a power level of up to 50 kW applied to the induction coil.

Using a segmented shield induction plasma tube, a solid material can be used as the starting material for making powders and sprays. The solid material may be a solid ingot, a mass of agglomerated material, loosely packed particulate or any other solid or quasi-solid form. The purity of the end product is directly related to the purity of the starting material. Therefore, it is an advantage to use a pure solid, such as a pure metal ingot, as a starting material. The need of processing to convert the solid to a powder or gaseous compound is not necessary when practicing the invention. A solid material is simply placed on a water-cooled hearth. Because of the segmented shield device of U.S. Pat. No. 4,431,901 it is possible to introduce the solid material directly into the plasma.

In addition to the use of solid ingots as a starting material, pure vapor (for example, pure metal), gas free plasmas can be made according to the present invention using the device disclosed in U.S. Pat. No. 4,431,901. This can be done because the device is not capacitively coupled as are conventional induction plasma tubes. Therefore, the enclosure may be evacuated and the vapor of the solid material itself can form the plasma.

In addition to enabling pure vapor plasmas to be formed, it has been found that the induction plasma tube taught by U.S. Pat. No. 4,431,901 can be electrically grounded. Conventional plasma tubes cannot be grounded because in such tubes the work coil is capacitively coupled to the plasma and consequently there is a high radio-frequency voltage on the plasma. If there is a ground near the tube, the plasma will be extinguished. If there is a more remote ground, the result may be severe voltage breakdown or arcing which would render the system inoperable. The device disclosed in U.S. Pat. No. 4,431,901 provides very little capacitive coupling because the shield effectively blocks the electric field of the coil. Consequently, the voltage on the plasma is so low that these problems just don't exist. In operation, the only element not grounded is induction coil 10.

Figure 3:
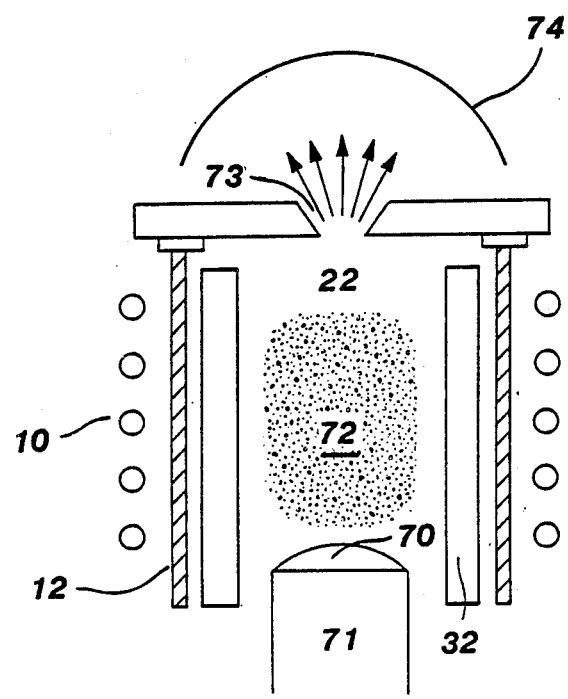
FIG. 3 is a schematic showing the device used for forming powders.

The plasma is formed from a starting ingot 70 shown in FIG. 3. The plasma used to make sure powders is form from a solid sample which is heated when a high frequency current is applied to an induction coil. It is not necessary that there be any ionizable gas such as argon for the invention to be used.

Using this method, the starting material, usually a pure solid, is vaporized by heating to form the plasma. This avoids the need for the argon or other ionizable gas used in conventional induction plasma tubes. Because a solid material is used as the starting material it is easy to control the purity of the final product. In fact, the purity of the powder product could conceptually be equal to the purity of the solid starting material.

FIG. 3 shows a material processing application which utilizes the inductively coupled plasma. The embodiment shown in FIG. 3 is for use in making ultrapure, ultrafine powders from solid ingot 70. A similar configuration may be used for coating applications. An ingot of solid material 70 is placed on a water-cooled copper hearth 71. When induction coil 10 is supplied with power the ingot is vaporized, forming plasma 72. The plasma, a metal or ceramic vapor, expands through nozzle 73 and settles on cold surface 74. Because the solid sample material 70 is used to form plasma 72, there are no impurities introduced into the system. Central cylindrical cavity 22 is evacuated in this embodiment to assure that there are no impurities.

Although FIG. 3 shows nozzle 73 to expand the vapor, nozzle 73 is not a requirement to practice the invention. While hypersonic expansion provided by a nozzle enables vapor to cool quickly, material tends to deposit around the mouth of nozzle 73. If nozzle 73 is used, it may be necessary to heat the nozzle area.

In a second application of vapor plasma, metal or ceramic coatings can be made by depositing the vapor onto surfaces. The thickness of the coating is a direct function of time.

This aspect of the invention enables coatings with a controlled composition to be deposited onto a surface. Pure coatings can be deposited without problems associated with gas plasmas.

As discussed above, it was discovered that segmented plasma tube 32 (FIG. 1) used to practice the invention may be grounded. This enables coating surface or target to be at one potential and the plasma to be at a different potential. By using different potentials, ion implantations or high-volume deposition can be accomplished.

For example, a negative voltage can be applied to the target to attract the positive ions in the vapor. The deposition efficiency is thus increased because less vapor misses the target. Also, the bias may be used to accelerate the ions for ion implantation.

The foregoing description of the methods of the invention have been presented for purposes of illustration and description. It is not intended to be exhaustive or to limit the invention to the precise forms disclosed. For example, although the discussion above is limited to ultrapure powders, it is also possible to make powders of controlled composition. Another possible application of the invention is to form gas-free plasmas from waste materials thus reducing their chemical bonds to relatively harmless atomic constituents. The methods and uses of the invention were chosen and described in order to best explain the principles of the invention and its practical application to thereby enable others skilled in the art to best utilize the invention in various embodiments and with various modifications as are suited to the particular use contemplated. It is intended that the scope of the invention be defined by the claimed appended thereto.

We claim:

1. A method of making fine powder in a gas-free environment using an electrically conductive ceramic or metal starting material which is initially in solid form comprising:

a. providing inductively coupled plasma apparatus comprising:
   (1) an electrical induction coil having a central longitudinal axis;
   (2) a dielectric tubular enclosure centered coaxially on said axis and located inside said coil;
   (3) a segmented metal radiation shield which is grounded and centered coaxially on said axis inside said enclosure, said shield consisting of a plurality of elongate fluid-cooled metal shield segments extending parallel to said axis, said segments being disposed in a circular arrangement adjacent the interior surface of said enclosure and being substantially equally spaced apart circumferentially such that said shield has a generally tubular configuration, and said shield segments being shaped in cross section so as to occlude line-of-sight transmission of light through said radiation shield; and
   (4) an outlet for material processed in said plasma apparatus;
b. placing said starting material within said radiation shield;
c. evacuating said tubular enclosure;
d. heating said starting material by use of said induction coil to vaporize said starting material and to form a plasma from the resulting vapor; and
e. utilizing a powder collection surface adjacent to said outlet of said plasma apparatus to collect material emanating from said outlet.

* * * * *